United States Patent [19]

Bergmann

[11] 4,403,014
[45] Sep. 6, 1983

[54] PROCESS OF DEPOSITING A HARD COATING OF A GOLD COMPOUND ON A SUBSTRATE FOR COATING JEWELRY AND THE LIKE

[75] Inventor: Erich Bergmann, Bienne, Switzerland

[73] Assignee: ASU Composants S.A., Les Ponts-de-Martel, Switzerland

[21] Appl. No.: 247,373

[22] Filed: Mar. 25, 1981

[30] Foreign Application Priority Data

Apr. 10, 1980 [CH] Switzerland .................. 2750/80

[51] Int. Cl.³ .................. B32B 15/04; C22C 1/04; C22C 1/05
[52] U.S. Cl. .................. 428/546; 428/621; 428/627; 428/672; 63/12; 63/20; 427/255
[58] Field of Search .............. 428/546, 621, 672, 627; 63/12, 20; 427/255

[56] References Cited

U.S. PATENT DOCUMENTS 4,226,932 10/1980 Ferraris .................. 428/627
4,252,862 2/1981 Nishida .................. 428/672

FOREIGN PATENT DOCUMENTS 2528255 2/1976 Fed. Rep. of Germany ...... 427/255
2705225 12/1977 Fed. Rep. of Germany .
563031 6/1975 Switzerland .................. 428/627
2962/74 11/1976 Switzerland .
2000812 1/1979 United Kingdom .

Primary Examiner—Veronica O'Keefe
Attorney, Agent, or Firm—Berger & Palmer

[57] ABSTRACT

The invention relates to a process of deposition of a coating of a gold compound on a solid substrate. In a vacuum chamber (1), the substrate is fixed on a first substrate electrode (2). A composite target (5) essentially consists of gold and at least one of the metal compounds, such as nitride, carbide and boride of the metals of group IV b of the periodic classification of elements and tantalum. A high-purity argon atmosphere at pressure ranging between $4 \times 10^{-4}$ and $3 \times 10^{-2}$ Torr is then established in the chamber. The deposition of the coating is then carried out by ionic deposition or evaporation in vapor phase at a given rate. The invention may find application to coat articles of jewelry or of watch cases.

10 Claims, 17 Drawing Figures

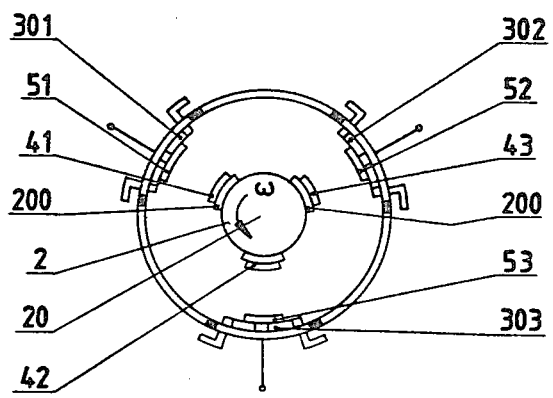
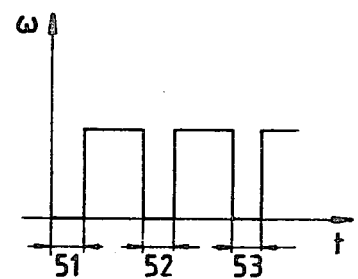
Fig. 6aFig. 6b
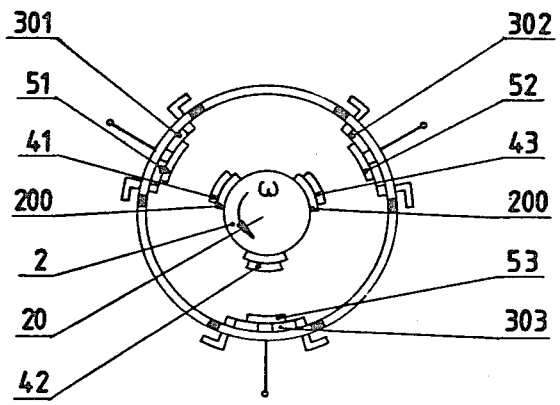
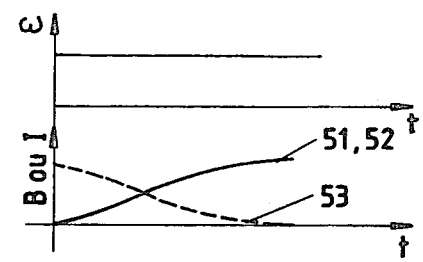
Fig. 7aFig. 7b

PROCESS OF DEPOSITING A HARD COATING OF A GOLD COMPOUND ON A SUBSTRATE FOR COATING JEWELRY AND THE LIKE

This invention concerns a process for depositing a hard coating of a gold compound on a surface and more particularly on a piece of jewelry.

Processes for depositing a hard coating of a gold compound have been the subject of numerous studies, particularly in the field manufacturing watch cases, in which the objective sought is to obtain for a hard solid substrate, with good scratch resistance, the appearance and glitter of gold, a noble but scratchable metal. Different processes have been used. Usually those processes consist of depositing on a solid substrate a layer or a nitrogen compound and a group IV metal or a mixture of those compounds. Such a process is described in Swiss Patent Application No. 2962/74, in which, by a process of vacuum evaporation of such substances, the depositing of hard layers makes it possible to manufacture pieces having great shock resistance against sharp objects and permanent coloration. Such a process, however, does not enable the coating to have the incomparable appearance of gold.

Another process, described in German Patent Application DOS No. 27 05 225, consists of making a coating comprised essentially of titanium nitride TiN, a compound well known for its yellow color resembling that of gold. Such a process does not produce a finish having the incomparable glitter of gold, which is indispensable for pieces of quality jewelry.

Another process, described in Britist Patent Application No. 2,000,812A, consists of depositing a layer of gold on a first layer of titanium nitride TiN by ionic deposition. The coating thus obtained, though making it possible to obtain an appearance close to that of gold, does not, however, produce a scratchproof surface because of the existence of the layer of pure gold superposed on the layer of titanium nitride between which layers there is weak adhesion.

The present invention makes it possible to solve the aforementioned problems and concerns a process of depositing a gold compound permitting the establishment of coatings having appreciably the appearance and glitter of gold.

Another object of this invention is to provide a process of depositing a gold compound in a coating having scratch resistance qualities comparable to those of nitrogen compounds of the metals of group IV b of the periodic classification of elements and, in particular, of titanium nitride.

A further object of this invention is to produce pieces of quality jewelry and watch parts at low cost.

According to the invention, the process consists of depositing the gold compound on a substrate in a vacuum chamber containing at least two electrodes. The substrate is fixed on a first substrate electrode and a composite target substantially comprising gold and at least one of the metal compounds, such as nitride, carbide and boride, of the metals of group IV b of the periodic classification of elements and tantalum is placed on a second electrode, called the target electrode. A high-purity argon atmosphere at low pressure, ranging between $4 \times 10^{-4}$ and $3 \times 10^{-2}$ Torr, is established in the vacuum chamber. The substrate undergoes ionic pickling and then deposition at a given rate is performed by the vapor-phase process. The vapor-phase deposition commprises deposition by evaporation or by cathode sputtering.

According to the invention, the resulting piece of jewelry contains on a solid substrate a coating consisting essentially of a mixture of gold and at least one of the metal compounds, such as nitride, carbide and boride, of the metals of group IV b of the periodic classification of elements and tantalum.

Such a process and the pieces of jewelry produced thereby can be used in goldsmithery and advantageously in the watch-making industry.

The invention will be better understood by means of the specification and drawings below, where the same references represent the same elements and the sizes and dimensions have not been followed in order to allow for a better understanding of the whole, in which:

FIGS. 6a and 6b represent another working variant of the process according to the invention;

FIGS. 7a and 7b represent another nonlimitative example of application of the process according to the invention;

Figure 1:
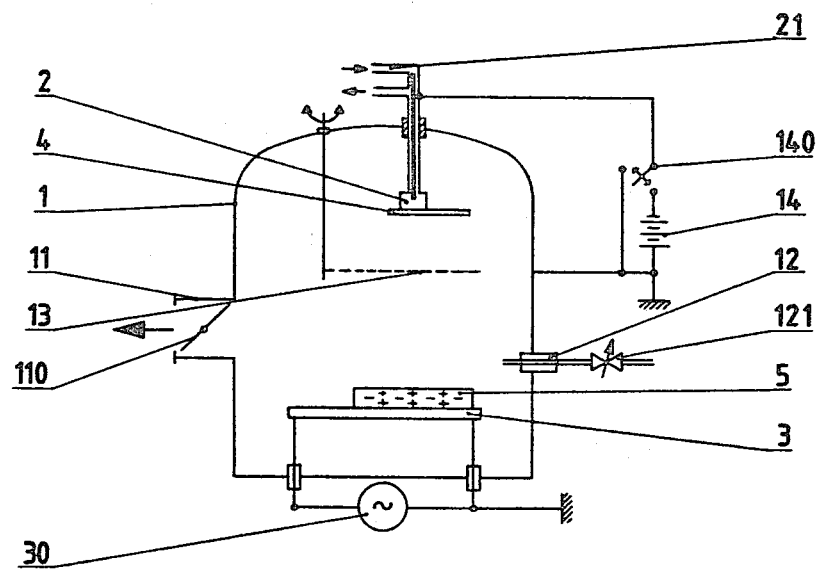
FIG. 1 represents a diagram illustrating the process according to the invention.

On FIG. 1 the process of deposition of a hard coating of a gold compound according to the invention consists of carrying out the following operations. In a vacuum chamber 1 containing at least two electrodes 2 and 3, substrate 4 is fixed on electrode 2, called the substrate electrode. Substrate electrode 2 is cooled by a water circulating device 21, for example, which also discharges the heat stored by the substrate in the course of the deposition process. A deposition target 5 is placed on electrode 3, which is called the target electrode. Target 5 is a composite substantially consisting of gold and at least one of the metal compounds, such as nitride, carbide and boride, of the metals of group IV b of the periodic classification of elements and tantalum. The gold is preferably pure gold or gold of a titer exceeding 18 carats.

A high-purity argon atmosphere is established in the vacuum chamber. For that purpose, the vacuum chamber is connected with a turbomolecular pump not shown on FIG. 1 through an opening 11 making it possible to create a vacuum in chamber 1 to $10^{-6}$ Torr. A pressure of argon or of any inert gas ranging between $4 \times 10^{-4}$ and $3 \times 10^{-2}$ Torr is established in vacuum chamber 1 by means of an injection nozzle 12 equipped with a precision valve 121 and by partial closing of a throttling valve 110.

An ionic pickling of substrate 4 is carried out by ionic erosion. For that purpose, vacuum chamber 1 is connected to the reference potential of the device and equipped with a moving screen 13 connected to that same reference potential and placed opposite substrate 4 during the pickling operation. A polarization system 14 equipped with a switch 140 makes it possible to bring the substrate electrode and the substrate to a negative potential in the order of 1 kV for a few minutes in order to guarantee, if necessary, pickling of the substrate. Moving screen 13 is then withdrawn. Deposition on substrate 4 from deposition target 5 is then carried out at a given rate of deposition, depending on the nature of the substrate, whether it be a watch case, luxury article or piece of jewelry. The rate of deposition can range between 0.1 and 10 μm per minute, depending on the substrate to be coated.

This substrate is a solid substrate of metal or sintered material. Deposition can be carried out, in the process according to the invention, either by ionic deposition, e.g., by cathode sputtering, or by vapor-phase deposition.

Figure 2:
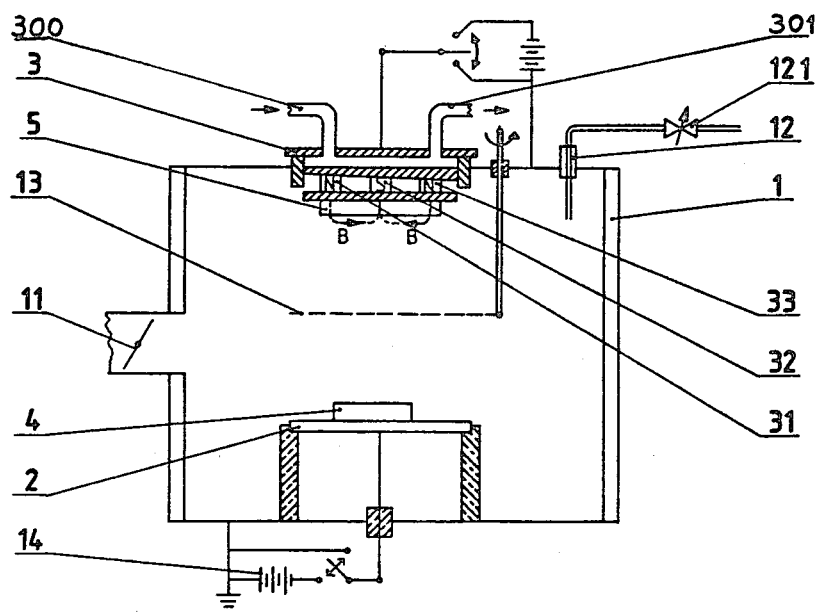
FIG. 2 represents a working variant of the process according to the invention.

The invention will, first of all, be described according to FIG. 2, in the case of cathode sputtering carried out by means of a vacuum chamber containing a flat magnetron. The vacuum chamber contains at least one anode, generally the wall of vacuum chamber 1, the potential of which is taken as reference potential, a substrate electrode 2 and a target electrode 3, constituting the cathode of the magnetron. That flat magnetron is represented on FIG. 2 by its cathode, containing a water cooling circuit 300, 301, and by permanent magnets 31, 32, 33, creating a magnetic field B parallel to target electrode 3. The process according to the invention consists of fixing the substrate 4 to be coated on substrate electrode 2 and fixing composite target 5 on target electrode 3. Composite target substantially consists of identical percentages by volume of metal nitrides, carbides and borides and of gold. Target electrode 3 constitutes the cathode of the magnetron.

A neutral atmosphere of pure or reactive argon, argon-nitrogen mixture, at pressures ranging between $1 \times 10^{-2}$ and $5 \times 10^{-2}$ Torr, is established in chamber 1. A pickling by ionic erosion of the substrate is carried out, if necessary, with substrate electrode 2 being brought, for example, to a negative potential in the order of 1.5 kV in relation to the reference voltage by polarization circuit 14, and screen 13 connected to that reference potential, with the screen 13 being inserted in the space lying between the substrate electrode and target electrode. The space between the electrodes, though not faithfully represented according to the proportions of FIG. 2, is on the order of about ten centimeters. The pressure is then lowered to between $4 \times 10^{-4}$ and $2 \times 10^{-2}$ Torr and target electrode 3 is, for example, brought to a negative potential (in the order of a few hundred volts) lower in absolute value than the voltage of the substrate electrode, so that the substrate current is less than the target current, according to the usual process of cathode sputtering, the screen being removed. The deposition of ions emanating from the target is thereby carried out on the substrate.

According to one nonlimitative characteristic of the invention, the composite target substantially consists of gold and a mixture of metal nitrides, carbides and borides, the gold and the mixture appreciably being in identical percentage by volume.

By way of example, for a target containing 50% gold and 50% mixture by volume, the mixture comprises titanium nitride TiN and titanium carbide TiC. The light gray titanium carbide TiC makes it possible, notably, to obtain a ligher gold color, the percentage of that constituent by volume enabling different shades of the gold color to be obtained. The percentage of titanium carbide by volume will not, however, exceed 30% in order to retain the gilt tone of the coating. Titanium carbide then plays a role similar to that of silver metal in the common gold plate alloys.

In order to obtain a coating of greater hardness, titanium carbide TiC can also be replaced by titanium boride TiB$_2$, likewise gray and of superior hardness, or by a TiC+TiB$_2$ mixture, the concentration of that mixture or of titanium boride TiB$_2$ alone not exceeding 10% by volume.

With a view to obtaining a paler gold color, titanium nitride TiN can also be replaced by a mixture of titanium nitride TiN and tantalum carbide TaC, the ratio of concentration by volume between titanium nitride and tantalum carbide not exceeding 4, that is, (TiN%/TaC%)≦4.

Figure 3A:
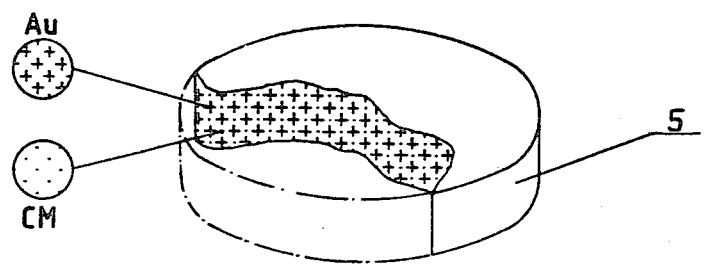
FIGS. 3a and 3b represents a working detail of application of the invention.

As represented in FIG. 3a, the composite target is a pellet or disc containing gold and at least one known metal compound CM of the metals of group IV b of the periodic classification of elements and tantalum. Pellet or disc 5 is produced, for example, by any known metallurgical process. In particular, as described in Swiss Pat. No. 532,125, the gold and metal nitride powder sintering process generally being difficult to use, composite target 5 consists of a rough compact made from powdered metal nitride, carbide and boride and gold, the composite target thereby constituting a cermet.

Figure 3B:
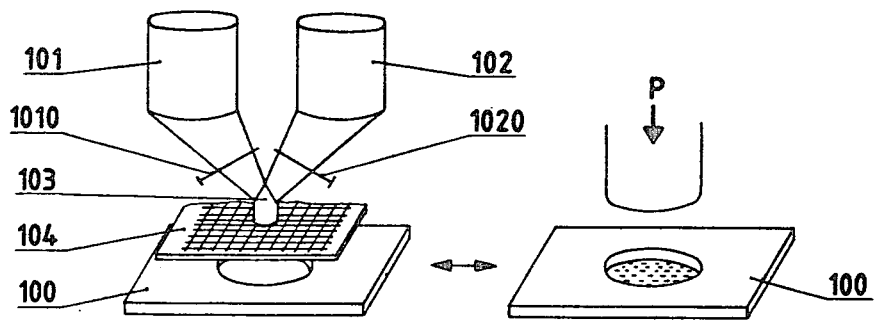

A preferred example of preparing such a cermet, is represented in FIG. 3b. A mixture of gold powder and metal nitride, carbide or boride powder is made, e.g., of titanium nitride TiN, in identical percentage by volume is combined. By way of a nonlimitative example, for a composite target of total weight approaching 25 grams, the mixture contains 19.33 g gold powder and 5.22 g titanium nitride. The powdered mixture is poured into a compacting mold 100 and then pressed at room temperature at pressure P ranging between 0.1 and 0.5 ton per cm$^2$ so as to obtain a final rough compact that can range between 100 μm and 2 to 3 mm. The rough compact thus produced constitutes one working example of the composite target.

By way of another example, the same composite target of total weight approximating 25 grams of mixture may contain 19.33 g of gold powder, 4.2 g of titanium nitride powder and 1.9 g of tantalum carbide powder. The titanium nitride can also, in this example, be advantageously replaced to obtain similar mechanical properties of the coating by a mixture of 4.2 g of titanium nitride and 0.3 g of titanium boride and 0.3 g of titanium carbide, that mixture constituting the compound CM. The mixture of gold powder and metal nitride, carbide and boride powder is obtained by means of the device represented in FIG. 3b, in which a set of two or more hoppers 101, 102, each containing a feed valve 1010, 1020, adjustable to the size of the powder stored in each hopper, supplies a mixing spout 103, which in turn feeds the mixture to a vibrating screen 104. Each of the hoppers is loaded with a powder of given nature or a pre-established mixture of those powders, gold or metal nitrides, borides and carbides, such as TiC, TiN, TaN, HfN and ZrN, and the vibrating screen delivers a homogeneous mixture. Such hopper systems are available on the market under the trade name of "Metco type 3MP Plasma Powder Feed Unit."

Figures 4A, 4B:
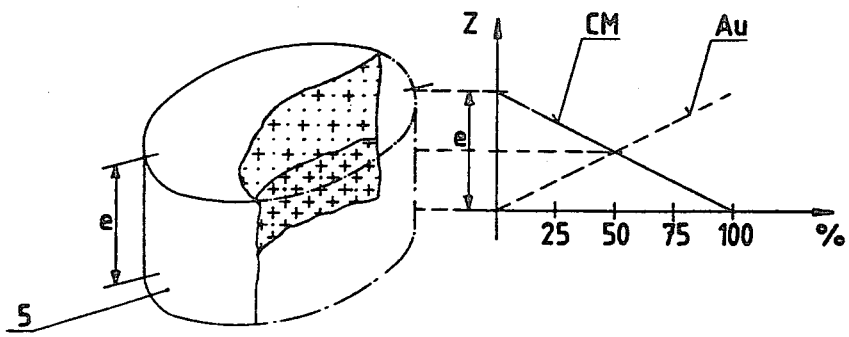
FIGS. 4a and 4b represent a working variant of a means of application of the invention.

FIG. 4a represents one particular embodiment of the composite target enabling the process of the invention to be used. According to FIG. 4a, composite target 5 consisting of a cermet contains, following its thickness e, a gradient of concentration by volume of metal compound CM and gold that is opposite. Dimension 0 of the thickness of composite target 5 represented on FIG. 4a is defined at the base of the target. The concentration in percentage by volume of gold and metal nitride, carbide and boride, as a function of dimension z along the thickness e of the target is linear as represented in FIG. 4b. Such a target makes it possible for use with the process of the invention to obtain a coating of similar structure, the progressive transition between metal nitride, carbide and boride and gold at the level of the target and of the coating deposited permitting a better approximation of the conditions of reflectivity, as a function of the wavelength of the incident light of the gold used in goldsmithery. The progressive transition also enables a perfect adhesion of the surface zones of the coating, consisting essentially of gold, to the very hard underlying zones of metal nitride, carbide and boride. Thus, for a target with gradient of concentration such that the percentage by volume of metal nitride, carbide and boride and of gold is identical at mid-thickness, making possible the deposition of a coating of similar structure, that coating, subjected to the hardness test according to the Vickers process, has a hardness exceeding 1000 Vickers.

The composite target having a gradient of concentration can be obtained by means of the equipment described with reference to FIG. 3b, the feed of the valves of hoppers 1010, 1020 being regulated as a function of thickness dimension z of the target. With a view to assuring at the coating level a preservation of the target gradient, each target, taking into account deposition efficiency k, has a thickness e approximately in the order of the inverse ratio, that is 1/k. Thus, for a coating of thickness e in the order of 2 $\mu$m, the target will have a thickness of close to 100 $\mu$m after pressing for k=0.28.

Figure 5A:
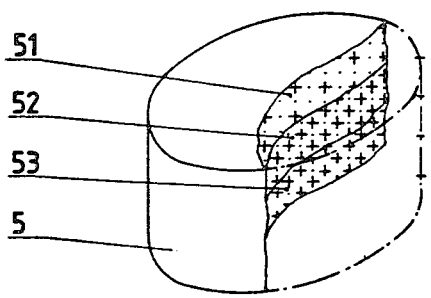
FIGS. 5a and 5b represent a preferential working variant of the means described on FIGS. 4a and 4b.
Figure 5B:
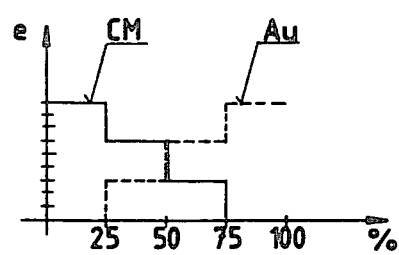

To facilitate preparation of the targets for a given coating, as represented in FIGS. 5a and 5b, the gradient of concentration by volume of metal nitride and gold is obtained by superposition of elementary layers, each consisting of a mixture of gold powder and metal nitride, carbide and boride powder of given respective concentration by volume.

Approximation of a linear function of concentration as a function of thickness by successive steps enables a simplification in the use of the device represented in FIG. 3b, and adjustment of the valves of the hoppers can be reduced to a discrete number of simple successive adjustments.

By way of example, as represented in FIGS. 5a and 5b, the target contains 3 elementary layers 51, 52, 53 that are symmetrical in relation to the half-thickness of the target. Layers 51, 52 and 53 contain by volume 75% gold and 25% metal nitride, carbide and boride, 50% gold and 50% metal nitride, carbide and boride, and 25% gold and 75% metal nitride, carbide and boride. Any embodiment containing a different number of layers and concentrations and, in particular, a surface layer, such as layer 51, consisting essentially of the gold used in goldsmithery, gold titering ≧ 18 carats may be used with this invention. With a view to providing the glitter of gold for the coating, the composite target consisting of cermet is placed on target electrode 3 so that the zone of the cermet having the highest gold concentration is in contact with the latter. Deposition is thus preferentially carried out for the metal compound or mixture of metal compounds and then successively for the gold.

The composite targets, as represented in FIGS. 4a and 5a, essentially consist of gold and titanium nitride, carbide and boride in identical percentage by volume or of gold and a mixture of metal nitrides, carbides and borides. The carbonitrides of said metals can further be used to constitute the composite targets.

According to another working example of the composite target, the mixture, appreciably in identical percentage by volume, consists of titanium nitride and zirconium nitride TiN, ZrN. For a target of approximately 50 grams:
38.66 g of gold Au
6.96 g of TiN
4.73 g of ZrN According to another working example of the composite target, the metal nitride mixture essentially consists of titanium nitride TiN, zirconium nitride ZrN and hafnium nitride HfN, that is, for example, for a target of approximately 50 g:
38.66 g of gold
6.96 of TiN
4.71 g of ZrN
0.02 g of HfN FIG. 6a represents another embodiment of the process according to the invention, as described with reference to FIG. 2. In FIG. 6a, the chamber contains three elementary target electrodes 301, 302 and 303 constituting a multiple cell device. Substrate electrode 2 rotates on an axis 20, target electrodes 301, 302 and 303 being placed in rotation around that axis. In fact, a multiple number of substrate-carrying platforms 200 can be provided on the periphery of substrate-carrying electrode 2. Such devices are currently available on the market.

The substrate to be coated 41, 42 and 43 is fixed on one of substrate-carrying platforms 200. Each elementary target electrode 301 and 302 receives an elementary target 51 and 52 with elementary targets 51 and 52 together constituting the composite target. By way of example, each elementary target 51, 52 and 53 consists of a mixture in given percentage by volume of gold and metal compound, and the set of elementary targets constituting a composite target gold and metal compound in identical percentage by volume.

For that purpose, each target 51 consists, for example, of a cermet, as previously described, containing 75% gold by volume and 25% metal nitrides, carbides and borides, target 52 contains 50% gold and 50% metal nitrides, carbides and borides, and target 53 contains 25% gold and 75% metal nitrides, carbides and borides by volume.

The substrate carried, for example, by platform 200 is first brought opposite target 53, then according to a pattern of motion ω of the substrate electrode, opposite targets 52 and 51, and so on, when an elementary layer of given thickness and corresponding concentration is deposited according to the aforesaid process phases making it possible to reconstitute the gradient of concentration of the coating by elementary layers. The rate of deposition of the elementary targets is adjustable independently by adjustment of the electric current supplying each elementary electrode or by adjustment of the magnetic field of the magnetron parallel to the surface of the substrate to be coated. As represented in FIG. 6b, for an identical time of exposure of each substrate in front of a given target, the electric current can be adjusted, taking into account the thickness of the elementary layer to be deposited, thus making it possible to simplify the movement ω of the substrate electrode, which is reduced to a uniform periodic motion.

This process is not limited to only three elementary targets, nor to the aforesaid relative concentrations and proportions. In particular, any process in which a first target consists of goldsmith's gold, gold titering higher than 18 carats, and there is at least one other target, consisting of pure titanium nitride TiN may be used with this invention.

As represented in FIG. 7a, the flat magnetron contains a target electrode having at least two elementary electrodes constituting a multiple cell device. The substrate electrode being driven at constant angular velocity, as on FIG. 7b, for example, at a velocity making possible an exposure of the substrate in front of each target at a frequency in the order of 500 Hz, the vacuum and ionic pickling conditions being previously fulfilled, deposition is carried out simultaneously from each target, the rate of deposition for each elementary target being regulated by means of electric current I or magnetic field B according to an opposite linear law. Each elementary target is composed, for example, of gold and pure metal compound respectively. Any embodiment in which a kinematic reversal of control is made, that is, in which, for example, a constant rate of deposition is provided for each elementary target, the exposure time being modulated according to a linear law as a function of the real concentration of each elementary layer of the coating may be used with this invention. The rate of deposition can in all cases be regulated by adjustment of the cathode current of each elementary target electrode.

According to a working variant of the invention, deposition is carried out by an ionic deposition of ionic plating type according to the Mattox process or activated by secondary discharges.

For that purpose, target electrode 3, normally at reference potential, as represented in FIG. 1, can, for example, be heated by the Joule effect by a heating circuit 30 to a temperature corresponding to a vapor pressure far exceeding the gas pressure in the chamber. Substrate electrode 2 is then, in the absence of screen 13, brought to a negative potential in the order of 10 kV by potential polarization system 14, as a function of the parameters of internal pressure of the vacuum chamber and substrate-target distance.

Figure 8A:
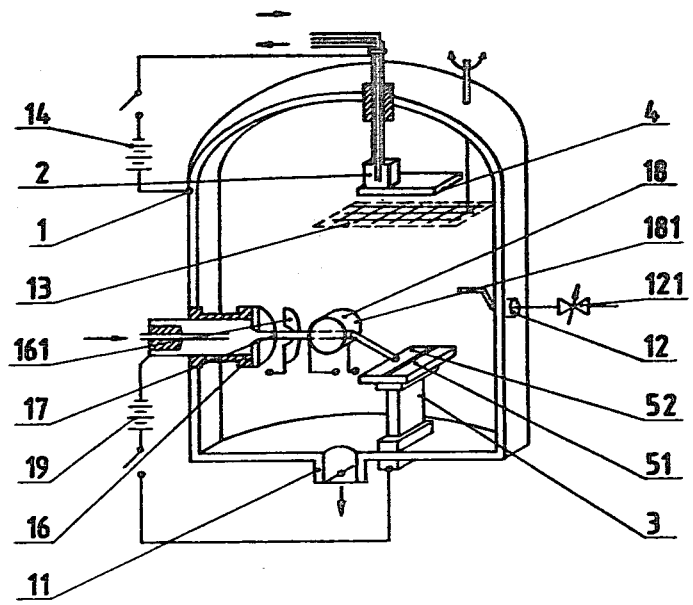
FIGS. 8a and 8b represent another example of application of the process according to the invention.

FIG. 8a relates to a working variation of the invention, deposition of the material constituting the target being carried out by vapor phase deposition. In that case, according to the sectional view of FIG. 8a, composite target 5 also consists of at least two elementary targets 51, 52, comprised respectively of gold titering less than 18 carats and of a metal compound mixture. In FIG. 8a the same references represent the same elements as those relating to the vacuum chamber of FIGS. 1 or 6. Vacuum chamber 1 further contains an electron gun 16 making possible the emission of an electron beam 17. Electron beam 17 is focused on composite target 51, 52 by focusing means 18 and makes possible the evaporation of the target by electron bombardment, composite target 51, 52 and target electrode 3 being brought to a positive potential in relation to electron gun 16 by a polarization circuit 19. For a more detailed description of the device, reference may be made, for example, to the article by Sonyi Komiya and Kazuyuki Tsurmoka entitled "Physical vapor deposition of thick Cr and its carbide and nitride films by hollow cathode discharge," published in the "Journal of the Vacuum Science and Technology," Volume 13, No. 1, January-February 1976.

According to the invention, electron beam 17 is periodically switched on each elementary target after the previously described stages of establishment of a pure argon atmosphere and ionic pickling have been carried out, as indicated above. Electron beam 17 is, for example, switched to a fixed frequency ranging between 30 and 100 Hz. For that purpose, focusing means 18 contain, for example, a control winding 181 enabling electron beam 17 to be switched by deflection.

The process according to the invention can also be used in a reactive atmosphere, the pure argon atmosphere being replaced, for example, by a 50—50 argon-nitrogen mixture by volume at the same pressure.

In order to guarantee a better yield of the gradient of concentration of the coating, electron beam 17 is modulated in intensity by a modulator electrode 161 placed in proximity to the electron gun and to which a negative voltage is applied in relation to electron gun 16. That modulator electrode appreciably plays the role of a Wehnelt electrode. Under identical pressure conditions, the rate of evaporation and, therefore, of deposition is a function of the intensity of electron beam 17.

Figure 8B:
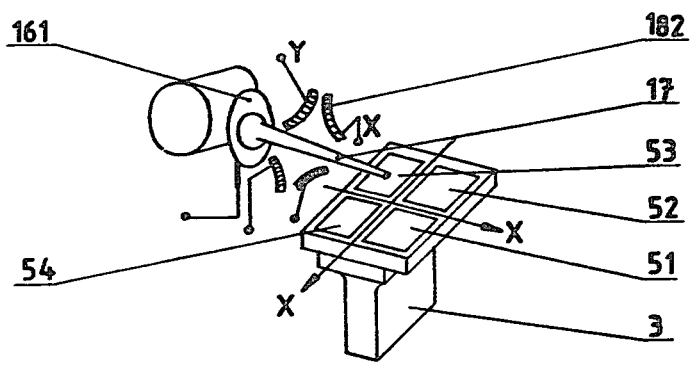

According to a working variant represented in FIG. 8b, the composite target consists of an arrangement of elementary targets 51, 52, 53, 54. Each elementary target consists, for example, of gold, titanium, hafnium and zirconium respectively, the vacuum chamber as a whole being subjected to a reactive atmosphere of 50% nitrogen and 50% argon, as previously described. Electron beam 17 is periodically switched on each elementary target at a fixed frequency ranging between 100 and 400 Hz. In order to guarantee more rapid and precise switching of the electron beam, winding 181 of the focusing means is replaced by a deflection device 182, such as, for example, a quadripolar lens making possible the switching at x, y of beam 17. For a more detailed description of the device equipped with a quadripolar lens, reference may be made to the usual television type scanning method well known to one versed in the art.

The process described and its different variants can be used for obtaining pieces of jewelry, such as, notably, watch cases or settings.

Figure 9A:
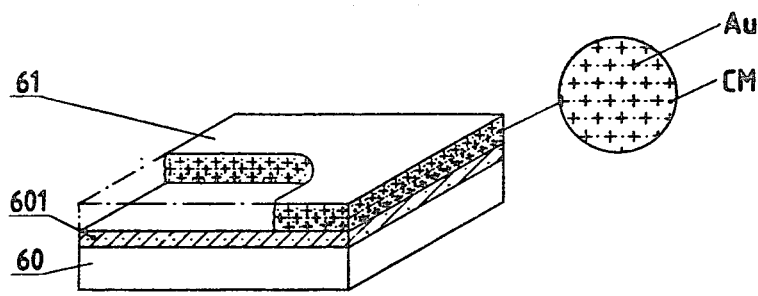
FIGS. 9a to 9c represent a piece of jewelry obtained by application of the process according to the invention.
Figure 9B:
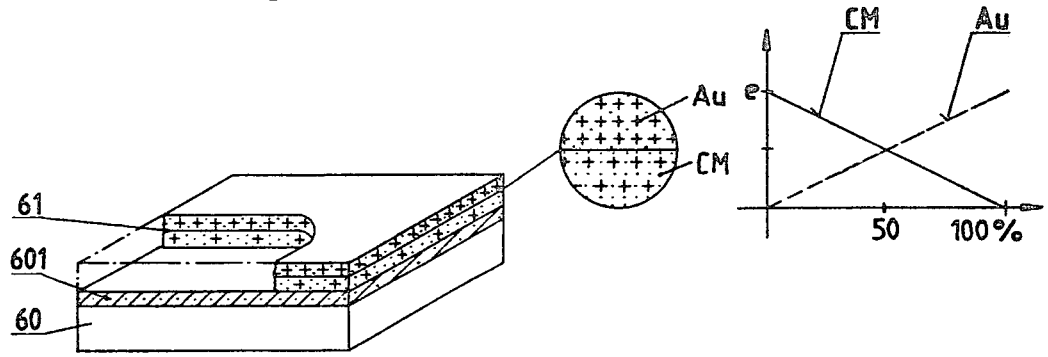
Figure 9C:
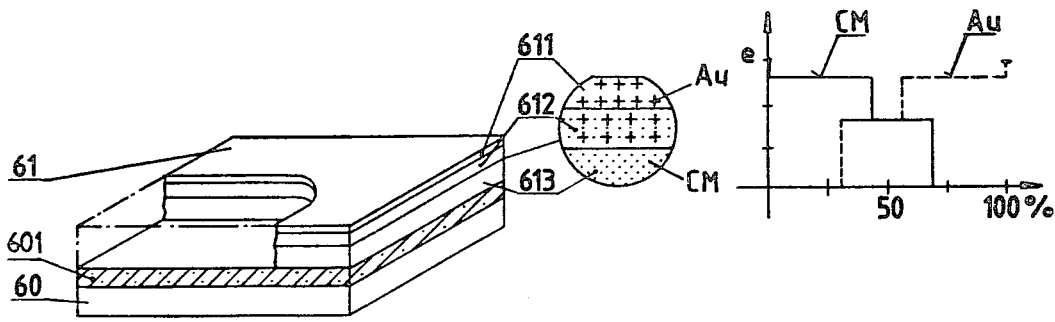

In general, the pieces of jewelry thus obtained contain, as represented in FIGS. 9a, 9b and 9c, on a solid substrate 60, a cheap metal substrate, such as brass, for example, a coating 61 consisting essentially of gold Au and metal compound CM in identical percentage by volume. In order to increase the hardness of the entire coating, an intermediate layer 601 can be placed between substrate 60 and the gold compound coating. Intermediate layer 601 can, for example, be deposited from an elementary target according to the process of the invention, the composite target consisting either of several other elementary targets or of a single composite target, as previously described in the process according to the invention. The intermediate layer preferably consists of stainless steel or of chromium over a thickness in the order of 5 to 20 μm or of titanium nitride TiN over a thickness of approximately 0.5 to 5 μm.

The coating can consist of a homogeneous mixture, as represented in FIG. 9a, or present, depending on its thickness e, a gradient of concentration by volume of metal nitride, carbide and boride and gold that is opposite, as represented in FIG. 9b. In this case, the zone of coating of highest concentration of metal nitride, carbide and boride lies in the vicinity of the coated face of the substrate or of intermediate layer 601 and the zone of coating with highest gold concentration being placed on the free coating surface, that zone giving the coating the glitter of gold. In general, that zone has a maximum thickness in the order of 0.1 μm, on which the coating appreciably consist of goldsmith's gold (18-carat gold), the adhesion of that surface zone to the underlying hard metal nitride zones being of excellent quality, owing to the progressive decrease, with thickness, of the concentration by volume of gold and the opposite progressive increase of metal compound, metal nitride, boride and carbide.

FIG. 9c represents a particularly important working variant of the gold compound coating object of the invention. In this case, the coating contains, depending on its thickness e, a superposition of elementary layers, each consisting of a mixture of metal nitride, carbide and boride and gold in given percentage by volume. By way of nonlimitative example, represented on FIG. 9c, coating 61 contains a surface layer 611 of 0.1 μm thickness consisting of 18-carat gold, an intermediate layer 612 of 0.5 μm thickness consisting of a mixture containing 60% gold by volume and 40% metal nitride and a layer of 1.5 μm thickness containing 30% gold and 70% metal nitride marked CM.

The metal nitride can in all cases be either a nitride of a metal of column IV b of the periodic classification of elements, such as titanium, zirconium or hafnium, or a mixture of those nitrides, or a mixture of those nitrides and carbide and boride of those metals and tantalum or said mixture further containing carbonitrides of those metals.

The protection is not limited to deposition of a hard coating of a gold compound.

Hard metal coating is to be understood as a coating obtained by the process according to the invention, in which the composite target appreciably consists of at least one of the noble metals of the gold, white gold, silver, rhodium, palladium, platinum, iridium and osmium group and of at least one of the metal compounds, such as nitride, carbide and boride of the metals of group IVb of the periodic classification of elements and tantalum.

The substitution of all or part of the volume of gold in the composite target by at least one of said noble metals makes it possible, notably, to obtain colors such as gilt, jewelry white and intermediate colors.

For this purpose, the cermet for use of the process contains in appreciably identical percentage by volume at least one of the noble metals of the gold, white gold, silver, rhodium, palladium, platinum, iridium and osmium group and at least one of the metal compounds, such as nitride, carbide and boride, of the metals of group IVb of the periodic classification of elements and tantalum.

The coating thus obtained essentially consists of at least one of the noble metals of the gold, silver, rhodium, palladium, platinum, iridium and osmium group and at least one of the metal compounds, such as nitride, carbide and boride, of the metals of group IV of the periodic classification of elements and tantalum.

The coating contains, depending on its thickness, an opposite gradient of concentration by volume of at least one of the noble metals of the aforesaid group and at least one of the metal compounds, such as nitride, carbide and boride of the metals of group IVb of the periodic classification of elements and tantalum. The gradient can be constituted by elementary layers, each consisting of a mixture of at least one of the noble metals of the gold, white gold, silver, rhodium, palladium, iridium and osmium group and at least one of the metal compounds, such as nitride, carbide and boride of the metals of group IVb of the periodic classification of elements and tantalum in given respective concentration by volume.

What is claimed is:

1. An article of jewelry comprising a solid substrate, and a coating on said substrate, said coating comprising a gold composite consisting essentially of at least one member of the group consisting of gold, silver, rhodium, palladium, platinum, iridium and osmium and at least one nitride, carbide or boride of a metal selected from the group consisting of the Group IV b elements and tantalum, said coating containing, depending upon its thickness, an opposite gradient of concentration by volume of said at least one member and said at least one nitride, carbide or boride.

2. A piece of jewelry according to claim 1, wherein the coating further comprises carbonitrides of a metal selected from the group consisting of the Group IV b elements and tantalum.

3. A piece of jewelry according to claim 1, and further comprising an intermediate layer between the substrate and the gold composite coating.

4. A piece of jewelry according to claim 1, wherein the intermediate layer is stainless steel.

5. A piece of jewelry according to claim 1, wherein the gold composite coating consists essentially of gold and a mixture of the metal nitrides, carbides and borides.

6. A piece of jewelry according to claim 1, wherein the metal nitride is titanium nitride.

7. A piece of jewelry according to claim 5, wherein the mixture comprises titanium nitride and zirconium nitride.

8. A piece of jewelry according to claim 5, wherein the mixture comprises titanium nitride, zirconium nitride and hafnium nitride.

9. A piece of jewelry according to claim 5, wherein the mixture comprises titanium nitride, titanium carbide, titanium boride and tantalum carbide.

10. A piece of jewelry comprising a solid substrate and a metal coating on said substrate, said coating consisting essentially of at least one member of the group consisting of gold, silver, rhodium, palladium, platinum, iridium and osmium and at least one nitride, carbide or boride, of a metal selected from the group consisting of the Group IV b elements and tantalum, wherein the metal coating contains, depending on its thickness, an opposite gradient of concentration by volume of said at least one member and said at least one nitride, carbide and boride.

* * * * *